(12) United States Patent
Lutz et al.

(10) Patent No.: US 9,208,839 B2
(45) Date of Patent: Dec. 8, 2015

(54) PREDICTING SATURATION IN A SHIFT OPERATION

(71) Applicant: ARM LIMITED, Cambridge (GB)

(72) Inventors: David Raymond Lutz, Austin, TX (US); Neil Burgess, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/220,490

(22) Filed: Mar. 20, 2014

(65) Prior Publication Data

US 2015/0269981 A1    Sep. 24, 2015

(51) Int. Cl.
*G11C 7/00* (2006.01)
*G11C 7/10* (2006.01)

(52) U.S. Cl.
CPC ................... *G11C 7/1084* (2013.01)

(58) Field of Classification Search
CPC ....... G06F 13/1684; G06F 7/762; G06F 9/34; G06F 5/01; G11C 7/1006; G11C 2029/0411; G11C 15/04; G11C 11/406; G11C 11/40603; G11C 2029/0401; G11C 2029/0405; G11C 2029/3202; G11C 2029/3602; G11C 29/16; G11C 29/44; G11C 29/848
USPC ........ 365/189.07, 49.17, 120, 185.03, 189.15
See application file for complete search history.

(56) References Cited

U.S. PATENT DOCUMENTS 4,899,304 A     2/1990   Terane et al.
2005/0219897 A1*  10/2005  Lin et al. .................. 365/185.03

FOREIGN PATENT DOCUMENTS

EP          1 696 314          8/2006

OTHER PUBLICATIONS

GB Search Report issued Sep. 2, 2015 in GB 1503641.1, 3 pages.

* cited by examiner

*Primary Examiner* — Thong Q Le
(74) *Attorney, Agent, or Firm* — Nixon & Vanderhye P.C.

(57) ABSTRACT

Apparatus for data processing and a method of data processing are provided. Shift circuitry performs a shift operation in response to a shift instruction, shifting bits of an input data value in a direction specified by the shift instruction. Bit location indicator generation circuitry and comparison circuitry operate in parallel with the shift circuitry. The bit location indicator indicates at least one bit location in the input data value which must not have a bit set if the shifted data value is not to saturate. Comparison circuitry compares the bit location indicator with the input data value and indicates a saturation condition if any bits are indicated by the bit position indicator for bit locations which hold set bits in the input data value. A faster indication of the saturation condition thus results.

16 Claims, 10 Drawing Sheets

```
%case (shift_left[1:0],
  2'b00: maskl_lvl1[2:0] = {3'b000},
  2'b01: maskl_lvl1[2:0] = {3'b100},
  2'b10: maskl_lvl1[2:0] = {3'b110},
  2'b11: maskl_lvl1[2:0] = {3'b111}
  );

%case (shift_left[3:2],
  2'b00: maskl_lvl2[14:0] = {            maskl_lvl1[2:0], {12{1'b0}}},
  2'b01: maskl_lvl2[14:0] = { {4{1'b1}}, maskl_lvl1[2:0],  {8{1'b0}}},
  2'b10: maskl_lvl2[14:0] = { {8{1'b1}}, maskl_lvl1[2:0],  {4{1'b0}}},
  2'b11: maskl_lvl2[14:0] = {{12{1'b1}}, maskl_lvl1[2:0],           }
  );

or:

%case (shift_right[1:0],
  2'b00: maskr_lvl1[10:0] = {4'b1111, {7{1'b0}}},
  2'b01: maskr_lvl1[10:0] = {4'b1110, {7{1'b0}}},
  2'b10: maskr_lvl1[10:0] = {4'b1100, {7{1'b0}}},
  2'b11: maskr_lvl1[10:0] = {4'b1000, {7{1'b0}}}
  );

%case (shift_right[3:2],
  2'b00: maskr_lvl2[14:0] = {{4{1'b1}}}, maskr_lvl1[2:0],           },
  2'b01: maskr_lvl2[14:0] = {            maskr_lvl1[2:0], {4{1'b0}}},
  2'b10: maskr_lvl2[14:0] = {15{1'b0}}                               ,
  2'b11: maskr_lvl2[14:0] = {15{1'b0}}
  );
```

FIG. 5A shift-left distance
| 0  | 00........00 | 15 |
| 1  | 10........00 | 14 |
| 2  | 11........00 | 13 |
| 3  | 111.......00 | 12 |
| .  |      .       | .  |
| .  |      .       | .  |
| .  |      .       | .  |
| 13 | 111......100 | 2  |
| 14 | 111......110 | 1  |
| 15 | 111......111 | 0  |
shift-right distance

FIG. 5B

LEFT SHIFT, UNSIGNED DATA

| 00100110 | data |
| 00000010 | distance |
| 11000000 | mask |
| 00000000 | AND |

| 00100110 | data |
| 00000011 | distance |
| 11100000 | mask |
| 00100000 | AND |

FIG. 6

LEFT SHIFT, SIGNED DATA

| 00011011 | data |
| 00000010 | distance |
| 11100000 | mask |
| 00000000 | AND |

| 00011011 | data |
| 00000011 | distance |
| 11110000 | mask |
| 00010000 | AND |

POSITIVE DATA

| 11101010 | data |
| 00010101 | inv'd data |
| 00000010 | distance |
| 11100000 | mask |
| 00000000 | AND |

| 11101010 | data |
| 00010101 | inv'd data |
| 00000011 | distance |
| 11110000 | mask |
| 00010000 | AND |

NEGATIVE DATA

RIGHT SHIFT & NARROW,   SIGNED DATA

| 00010110 | data |
| 00000010 | distance |
| 11100000 | mask |
| 00000000 | AND |

| 00010110 | data |
| 00000001 | distance |
| 11110000 | mask |
| 00010000 | AND |

POSITIVE DATA

| 11101001 | data |
| 00010110 | inv'd data |
| 00000010 | distance |
| 11100000 | mask |
| 00000000 | AND |

| 11101001 | data |
| 00010110 | inv'd data |
| 00000001 | distance |
| 11110000 | mask |
| 00010000 | AND |

NEGATIVE DATA

PREDICTING SATURATION IN A SHIFT OPERATION

BACKGROUND OF THE INVENTION

1. Field of the Invention

The present invention relates to the field of data processing systems. More particularly, this invention relates to data processing systems which are configured to perform a shift operation on an input data value.

2. Description of the Prior Art

It is known for a data processing system to be responsive to a shift instruction to perform a shift operation on an input data value, whereby the individual bits of the input data value are shifted by a specified shift distance either to the left or the right to generate a shifted data value. It is further known that when performing a shift operation it is possible for set data bits (i.e. typically 1's) in the input data value to be shifted to higher most significant bit positions than can be accommodated within the output data value, and as such the output data value is described as having "saturated". Generally in this situation a maximum or minimum data value for the specified data range of the output data value is returned instead of the shifted data and the fact that the output data value has saturated is flagged.

SUMMARY OF THE INVENTION

Viewed from a first aspect, the present invention provides apparatus for data processing, comprising:

shift circuitry configured to perform a shift operation in response to a shift instruction, wherein the shift operation is performed on an input data value and comprises shifting bits of the input data value in a direction specified by the shift instruction to generate a shifted data value;

bit location indicator generation circuitry configured to generate a bit location indicator, wherein the bit location indicator indicates at least one bit location in the input data value which must not have a bit set if the shifted data value is not to saturate; and comparison circuitry configured to compare the bit location indicator with the input data value and to indicate a saturation condition if any bits are indicated by the bit location indicator for bit locations which hold set bits in the input data value, wherein the bit location indicator generation circuitry and comparison circuitry are configured to operate in parallel with the shift circuitry.

The present technique recognises that a disadvantage of the known prior art techniques for identifying saturation as a result of a shift operation is that these are dependent on examining the result of the shift operation and determining with respect to the bits of the input data value which have been shifted past the most significant bit position of the result value whether such saturation has occurred. The present technique recognises that a faster identification of such saturation can be provided. To do this, bit location indicator generation circuitry and comparison circuitry are provided which are configured to operate in parallel with the usual shift circuitry which carries out the shift operation in response to the shift instruction. The bit location indicator generation circuitry generates a bit location indicator which indicates those bit locations in the input data value which, if holding set bits, will result in the saturation of the shifted data value. In other words, the bit location indicator indicates those bit locations in the input data value which will be shifted out of range for the shifted (output) data value. By a comparison of this bit location indicator with the input data value, it can thus be determined if the shift operation will result in saturation by determining if there are any bits set in the input data value at the position(s) indicated by the bit location indicator. Due to the fact that the bit location indicator generation circuitry and comparison circuitry are configured to perform these operations in parallel with the operation of the shift circuitry, the identification of the saturation condition can be generated earlier (for example a processor cycle earlier), thus advantageously speeding up the execution of such shift instructions.

The bit location indicator could take a number of forms, and in some embodiments the bit location indicator generation circuitry comprises mask generation circuitry configured to generate a mask data value as the bit location indicator, wherein the mask data value has bits set at bit locations corresponding to bit locations in the input data value which must not have bits set if the shifted data value is not to saturate. Accordingly the mask data value can then correspond to the input data value—for example having the same width as the input data value—and bit locations in the mask data value can be map to bit locations in the input data value. The comparison circuitry can then for example perform a bit-wise comparison of the mask data value and the input data value to determine if the saturation condition arises.

In some embodiments the mask data value comprises a sequence of set bits concatenated with a sequence of unset bits, wherein the relative lengths of the sequence of set bits and the sequence of unset bits is determined in dependence on a shift distance specified by the shift instruction. This representation thus enables the input data value to be considered in two portions, one indicated by the set bits of the mask data value and one indicated by the unset bits of the mask data value, and in particular the portion represented by the set bits of the mask data value thus indicates the portion of the input data value in which there can be no bits set for the shift operation specified by the shift instruction having this shift distance. The boundary between the first and second portion depends on the shift distance and hence the relative lengths of the sequence of set and unset bits is given by the specified shift distance.

In some embodiments the apparatus further comprises inversion circuitry configured to invert the input data value to generate an inverted input data value when the input data value is a negative signed data value, and the bit location indicator generation circuitry and the comparison circuitry are configured to substitute the inverted input data value for the input data value. The present technique recognises that by comparison with a positive signed input data a negative signed data value makes rather different usage of set and unset bits in the representation of the data value and hence it is advantageous, rather than providing more complex bit location indicator generation circuitry and comparison circuitry configured to handle both positive and negative signed data values, if the apparatus further comprises inversion circuitry which inverts the input data value when it is a negative signed data value, such that the bit location indicator generation circuitry and comparison circuitry can then operate in exactly the same manner as for a positive signed data value.

The present technique further recognises that the particular form of the mask data value generated by the mask generation circuitry will need to vary if the apparatus is to handle shift operations with respect to different types of input data value. Hence, in one embodiment the shift operation is a left shift and the input data value is an unsigned data value, and the mask generation circuitry is configured to generate the mask data value comprising a left-aligned sequence of set bits of a length given by the shift distance followed by a sequence of unset bits which complete the mask data value. Here, where the shift operation is a left shift, it is the most significant (left-most) bits of the input data value which have the potential to result in the saturation condition and the left-aligned sequence of set bits in the mask data value corresponds to these bit positions in the input data value.

In the situation where the input data value is a signed data value the sign bit (at the most significant bit position of the input data value) represents an additional bit of the input data value which must be correctly preserved in a left shifted data value and accordingly in one embodiment the shift operation is a left shift and the input data value is a signed data value, and the mask generation circuitry is configured to generate the mask data value comprising a left-aligned sequence of set bits of a length given by the shift distance plus one, followed by a sequence of unset bits which complete the mask data value. Here, where the shift operation is a left shift, it is the most significant (left-most) bits of the input data value which have the potential to result in the saturation condition and the left-aligned sequence of set bits in the mask data value corresponds to these bit positions in the input data value.

Conversely (with respect to left shifts) it is generally the case that a right shift operation will not result in such a saturation condition, due to the fact that the set bits of the input data value are being shifted away from the most significant bit positions. However, the present technique recognises that where the shift operation is a right shift and narrowing operation, i.e. the output data value has a smaller data width than the input data value, the potential for saturation to occur exists. Hence, in one embodiment the shift operation is a right shift and narrowing operation to generate a narrowed shifted data value and the input data value is an unsigned data value, and the mask generation circuitry is configured to generate the mask data value comprising a left-aligned sequence of set bits of a length given by the data width of the input data value minus the data width of the narrowed shifted data value minus the shift distance followed by a sequence of unset bits which complete the mask data value. This enables the mask data value to identify those positions in the input data value which, when right shifted, may nevertheless remain above (i.e. at higher significant bit positions) than can be accommodated by the narrowed shifted data value.

In the situation where the input data value is a signed data value the sign bit (at the most significant bit position of the input data value) represents an additional bit of the input data value which must be correctly preserved in a narrowed and right shifted data value (i.e. must be shifted to within the range of the narrowed shifted data value) and accordingly in one embodiment the shift operation is a right shift and narrowing operation to generate a narrowed shifted data value and the input data value is a signed data value, and the mask generation circuitry is configured to generate the mask data value comprising a left-aligned sequence of set bits of a length given by one plus the data width of the input data value minus the data width of the narrowed shifted data value minus the shift distance followed by a sequence of unset bits which complete the mask data value. This enables the mask data value to identify those positions in the input data value, including the sign bit, which when right shifted will remain above (i.e. at higher significant bit positions) the bit positions that can be accommodated by the narrowed shifted data value.

In some embodiments, the shift operation is a right shift and narrowing operation to generate a narrowed shifted data value, and the apparatus is configured to identify if the shift distance is greater than a value given by the data width of the input data value minus the data width of the narrowed shifted data value and to override the mask generation circuitry and comparison circuitry to indicate that the saturation condition is not met. This recognises that in the context of a right shift and narrowing operation, where the shift distance is greater than the data width of the input data value minus the data width of the narrowed shifted data value, it is not possible for saturation to occur and that in some configurations it may be advantageous to be able to override the mask circuitry and comparison circuitry in this situation and directly indicate that the saturation condition is not met.

The present technique further recognises that rather than generate a full new mask data value for each different configuration of shift direction, input data value type, and shift distance, the similarities between some of these mask data value types may advantageously be used to provide more efficient mask generation circuitry. Accordingly, in one embodiment when the shift operation is a left shift the mask generation circuitry is configured to generate the mask data value to comprise a left-aligned sequence of set bits of a length given by the shift distance followed by a sequence of unset bits which complete the mask data value, and the mask generation circuitry is configured to use the mask data value unamended if the input data value is an unsigned data value and to right shift the mask data value and append a set bit at a most significant bit position if the input data value is a signed data value. In a similar fashion, in one embodiment when the shift operation is a right shift and narrowing operation the mask generation circuitry is configured to generate the mask data value to comprise a right-aligned sequence of unset bits of a length given by the data width of the input data value minus the data width of the narrowed shifted data value plus the shift distance minus one preceded by a sequence of set bits which complete the mask data value, and the mask generation circuitry is configured to use the mask data value unamended if the input data value is a signed data value and to left shift the mask data value and append an unset bit at a least significant bit position if the input data value is an unsigned data value.

It will be recognised by one of ordinary skill in the art that the "setting" of a bit at a particular bit location in a data value may be represented by giving that bit a value of 1, but that this is an entirely arbitrary (albeit conventional) choice and accordingly in some embodiments a bit set at a bit location has a value of 1 and an unset bit at the bit location has a value of 0, whilst in other embodiments a bit set at a bit location has a value of 0 and an unset bit at the bit location has a value of 1.

The present technique recognises that it may be the case that some shift operations are encoded by their shift instructions as having a negative shift distance. For example, a right shift may be encoded as a left shift with a negative shift distance. Accordingly, in some embodiments the apparatus further comprises negative shift distance identification circuitry configured to identify if the shift distance has a negative value and, if the shift distance does have a negative value, to cause the mask generation circuitry to interpret the shift distance as a positive value in association with a shift operation in an opposite direction to that specified by the shift instruction. This advantageously enables the mask circuitry and comparison circuitry to have the same configuration and further modification to cope with negative shift distances is not required.

The apparatus may respond to the identification of the saturation condition in a variety of ways, but in some embodiments the shift circuitry is configured, in response to the saturation condition, to output the shifted data value having a maximum value for the data width of the shifted value when the input data value is an unsigned data value or a positive signed data value, and is configured to output the shifted data value having a minimum value for the data width of the shifted value when the input data value is a negative signed data value.

As mentioned above, the bit location indicator could take a number of forms, and in some embodiments the bit location indicator generation circuitry is configured to generate the bit location indicator having a value indicative of the at least one bit location. Accordingly in such embodiments it is the value of the bit location indicator which indicates the at least one bit location in the input data value which must not have a bit set if the shifted data value is not to saturate. For example the value of the bit location indicator could simply be the bit position number of one bit location in the input data value which must not have a bit set if the shifted data value is not to saturate. More generally a bit-wise representation of more than one bit location could be given by the value of the bit location indicator. However represented, this information guides the comparison circuitry in which bit locations of the input data value to examine.

Viewed from a second aspect the present invention provides a method of data processing comprising the steps of:

performing a shift operation in response to a shift instruction, wherein the shift operation is performed on an input data value and comprises shifting bits of the input data value in a direction specified by the shift instruction to generate a shifted data value;

generating a bit location indicator, wherein the bit location indicator indicates at least one bit location in the input data value which must not have a bit set if the shifted data value is not to saturate;

comparing the bit location indicator with the input data value; and indicating a saturation condition if any bits are indicated by the bit position indicator for bit locations which hold set bits in the input data value, wherein the generating, comparing and indicating steps as a group are performed in parallel with the performing a shift operation step.

Viewed from a third aspect the present invention provides apparatus for data processing, comprising:

means for performing a shift operation in response to a shift instruction, wherein the shift operation is performed on an input data value and comprises shifting bits of the input data value in a direction specified by the shift instruction to generate a shifted data value;

means for generating a bit location indicator, wherein the bit location indicator indicates at least one bit location in the input data value which must not have a bit set if the shifted data value is not to saturate;

means for comparing the bit location indicator with the input data value; and means for indicating a saturation condition if any bits are indicated by the bit location indicator for bit locations which hold set bits in the input data value, wherein the means for generating, comparing and indicating as a group are configured to operate in parallel with the means for performing a shift operation.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

Figure 1:
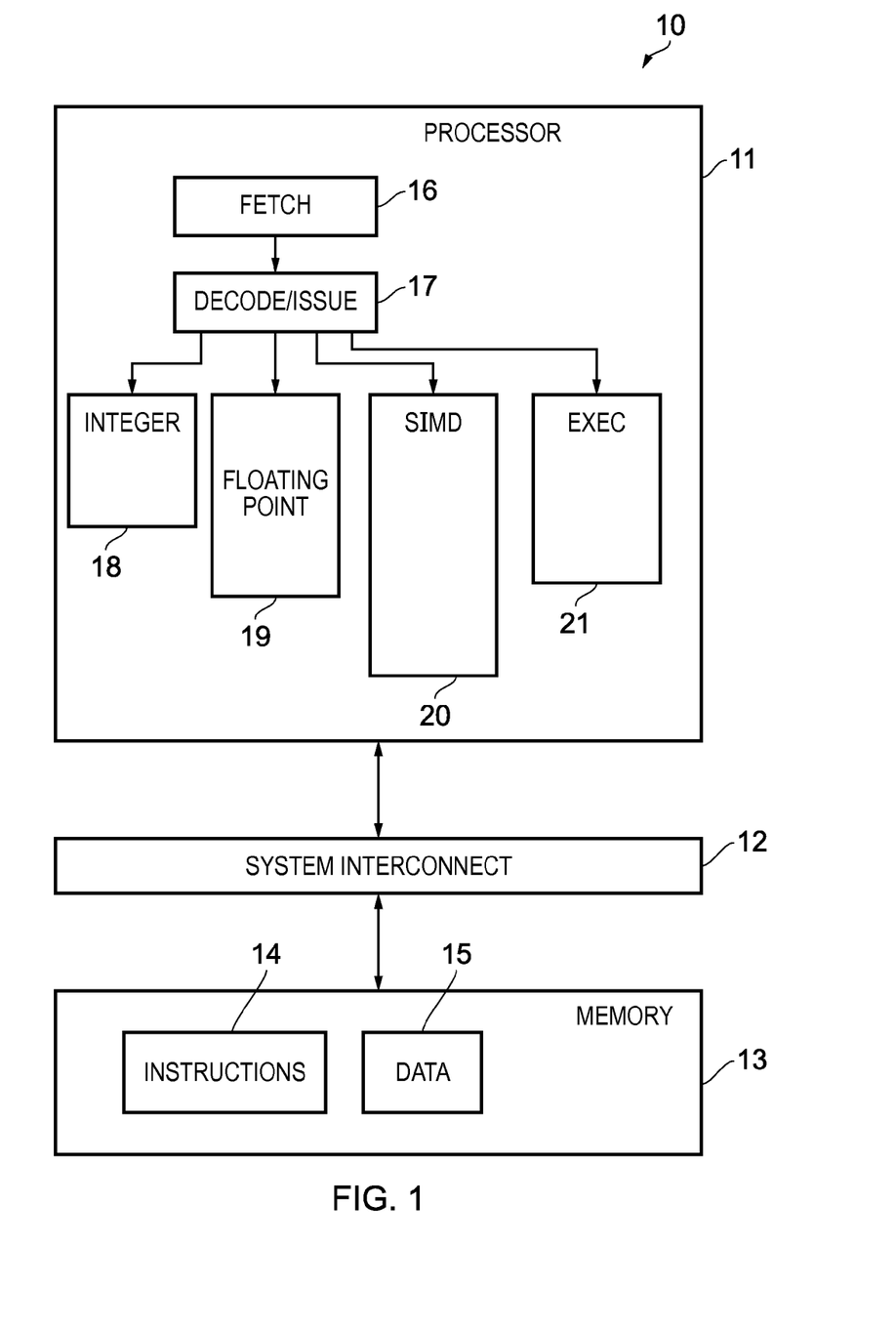
FIG. 1 schematically illustrates a data processing system including execution pipelines which include shift circuitry configured to perform shift operations in one embodiment.

FIG. 1 schematically illustrates a data processing system 10 including a processor 11 and a memory 13. The processor is configured to access the content of the memory 13 via the system interconnect 12. The memory stores program instructions 14 which configure the data processing operations performed by the processor 11 and select the data 15 on which those data processing operations are carried out. The processor 11 performs its data processing operations, as specified by the program instructions 14, by means of a processing pipeline which (as schematically illustrated in FIG. 1) includes a fetch stage 16, a decode and issue stage 17 and a number of different execution pipelines 18, 19, 20 and 21. The execution pipeline may include an integer pipeline 18, a floating point pipeline 19, a SIMD (single instruction multiple data) pipeline 20 and a general purpose execution pipeline 21. The present techniques are related to shift circuitry configured to perform a shift operation in response to a shift instruction and this shift circuitry may be found in any of the execution pipelines 18-21 shown in FIG. 1.

Figure 2:
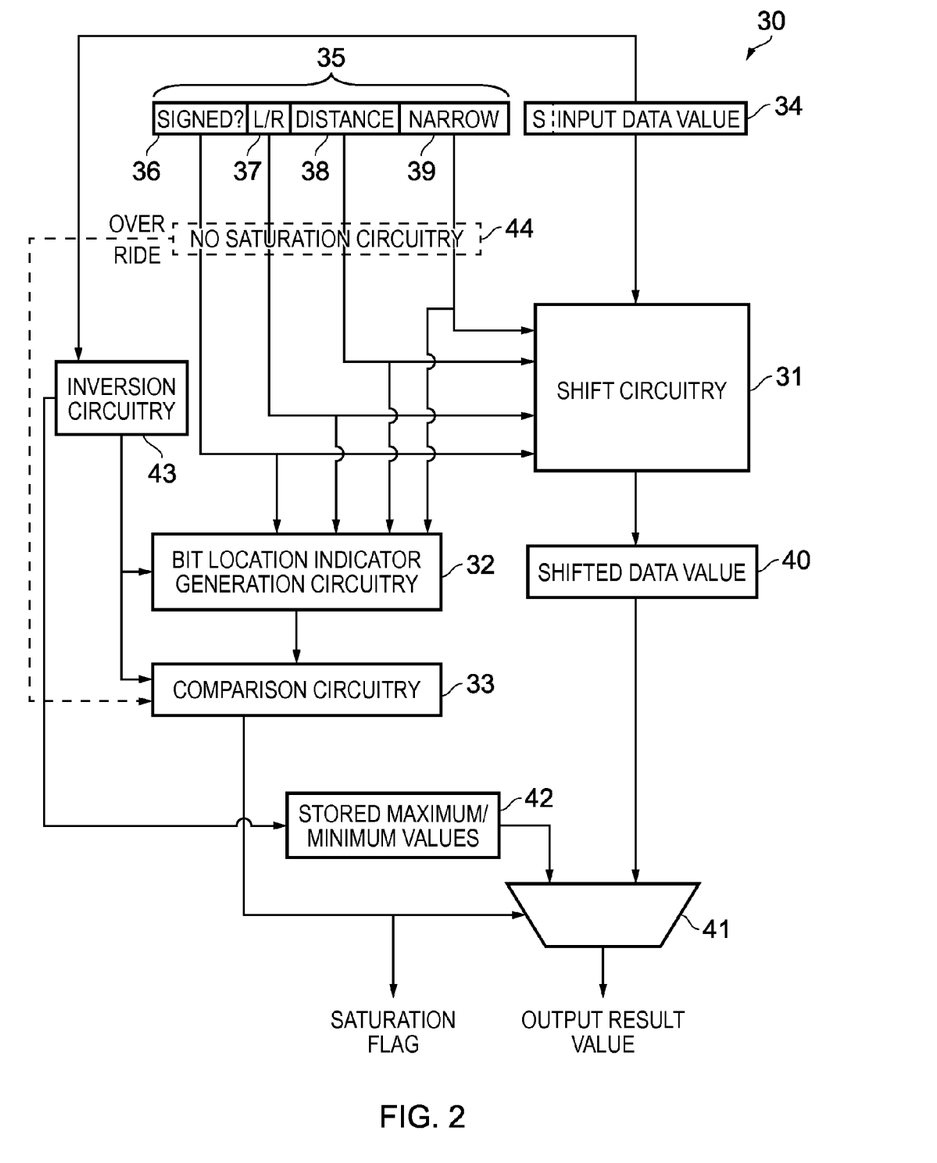
FIG. 2 schematically illustrates shift circuitry configured to perform shift operations and associated mask generation circuitry and comparison circuitry in one embodiment.

FIG. 2 schematically illustrates a set of components 30 which are found in one of the execution pipelines shown in FIG. 1 and enable the execution pipeline, in parallel to performing a shift operation in response to a shift instruction, to generate a fast indication of whether a saturation condition exists, wherein the output result value generated by performing the shift operation on the input data value has overflowed, and the data range of the output result value cannot represent the shifted version of the input data value. The three main components of those shown in FIG. 2 are the shift circuitry 31, the bit location indicator generation circuitry 32 and the comparison circuitry 33. The shift circuitry 31 is configured to perform shift operations in response to shift instructions, receiving an input data value 34 and configuring its operations in dependence on various items of information 35 specified in the shift instruction. For example, the shift instruction provides information 36 indicating whether the input data value is a signed or unsigned data value, an indication 37 of whether the shift operation is a left shift or a right shift, the shift distance 38 (i.e. the number of bits by which the input data value should be shifted in the specified direction), and information 39 indicating whether this shift operation is a shift and narrow operation. Note that the information 39 specifying whether the shift operation is also a narrowing operation could take the form of a simple flag where the narrowed shifted data value has a predetermined data width in the data processing apparatus, or the information 39 could take the form of a representation of the data width of the output data value, such that if this data width matches the input data width it is not a narrowing operation, but if the width of this output data value is less than the width of the input data value it is a narrowing operation. As a result of the shift operation performed by the shift circuitry 31 a shifted data value 40 is generated.

The present techniques provide bit location indicator generation circuitry 32 and comparison circuitry 33 in association with the shift circuitry 31, in order to provide a fast indication of whether a saturation condition exists for the shifted data value 40, i.e. whether this shifted data value 40 has saturated as a result of the shift operation performed by the shift circuitry 31. To do this, as will be described in more detail with reference to the figures which follow, the bit location indicator generation circuitry 32 generates a bit location indicator which indicates the bit location(s) where the input data value must not have bits set if the shifted data value is not to saturate. This bit location indicator is, in some of the embodiments described, a mask data value which is then compared by the comparison circuitry 33 with the input data value 34 and if this comparison (for example by a bit-wise AND operation) indicates any bits are set at the same bit locations in the respective values, then the saturation condition exists. As a result a saturation flag is then output in association with the output result value and a multiplexer 41 is used to select a maximum or minimum value to output in the place of the shifted data value 40.

The components in FIG. 2 also comprise inversion circuitry 43 which receives the input data value 34 and, if this is a negative data value (i.e. if the most significant bit, shown as S in input data value 34 in FIG. 2, is set) the inversion circuitry 43 is configured to generate an inverted (i.e. positive) version of the input data value which the bit location indicator generation circuitry 32 and comparison circuitry 33 use in place of the input data value 34. The information as to whether the input data value 34 is positive or negative is also provided as an input to the stored maximum/minimum data values 42 such that, when one of these values is required to replace a saturated value, a maximum data value can be output for a positive signed or unsigned data value and a minimum data value can be output for a negative signed data value. Finally, the components shown in FIG. 2 may further comprise "no saturation" circuitry 44, which is configured to determine from the information provided by the shift instruction a particular circumstance under which no saturation is possible and to provide an override signal to comparison circuitry 34 such that a no saturation indication can be directly output (i.e. the saturation flag is not set). Whether it is deemed to be worthwhile to provide this "no saturation" circuitry 44 depends on the particular relative timing of the bit location indicator generation circuitry 32, comparison circuitry 33 and shift circuitry 31. Typically, this "no saturation" circuitry 44 is not required, since the saturation flag is only generally required in association with the output result value and the bit location indicator generation circuitry 32 and comparison circuitry 33 are configured to operate in parallel with the shift circuitry 31, and therefore do not generally represent a slowest path which it is beneficial to bypass. However, in configurations where it is beneficial to know the saturation status as soon as possible, provision of the "no saturation" circuitry 44 may be deemed worthwhile.

Figure 3:
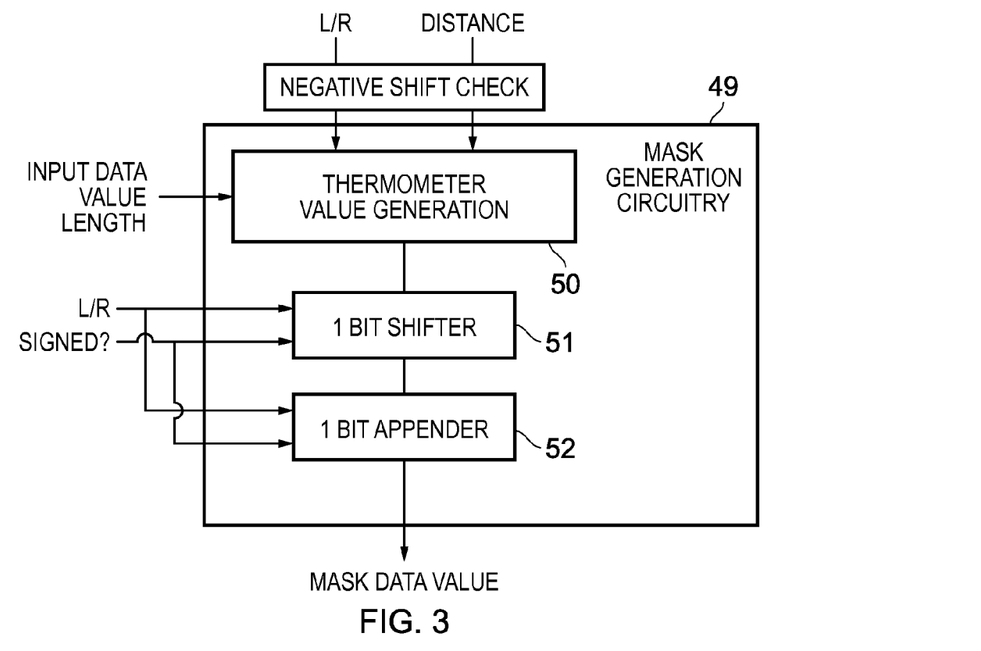
FIG. 3 schematically illustrates mask generation circuitry in one embodiment.
Figure 5A:
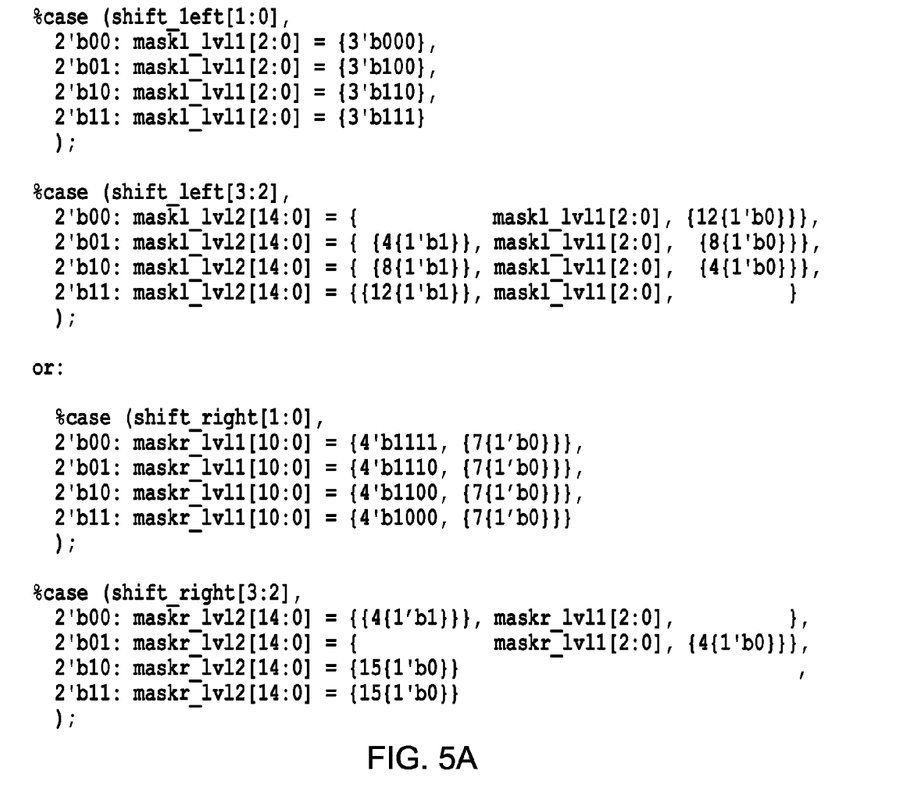
FIG. 5A shows example Verilog code for generating mask data values in one embodiment.
Figure 5B:
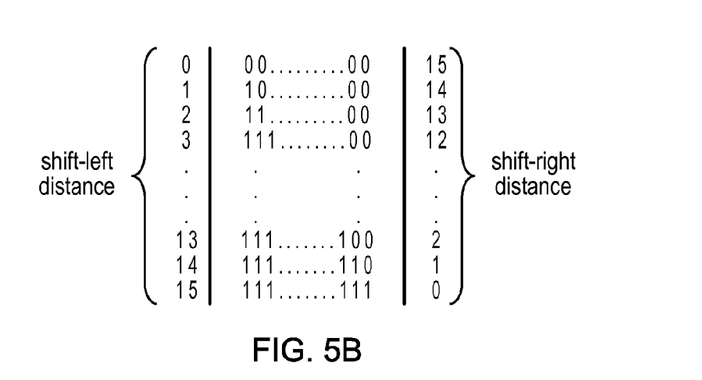
FIG. 5B shows the mask data values which correspond to the Verilog code of FIG. 5A.

FIG. 3 schematically illustrates in more detail the bit location indicator generation circuitry 32, in an embodiment where is it configured as mask generation circuitry 49. The central feature of the mask generation circuitry 49 is the thermometer value generation unit 50, which, as will be described below in more detail with reference to FIGS. 5A and 5B, is configured to generate a thermometer value comprising a sequence of set bits concatenated with a sequence of unset bits. In the embodiments illustrated herein a set bit is represented by 1, whilst an unset bit is represented by a 0. However, it will be clear to one of ordinary skill in the art that this choice of representation is arbitrary and a set value could be represented by 0 and an unset value could represented by 1, the embodiments described herein thus simply having all 1s and 0s transposed.

For some shift operation configurations the thermometer value generated by thermometer value generation unit 50 is used directly as the mask data value, but if the shift operation is a left shift and the input data value is a signed data value, the one bit shifter 51 right shifts the output of the thermometer value generation unit 50 by one bit to the right and the one bit appender 52 appends a set bit (i.e. 1) at a most significant bit position to generate the mask data value. Conversely, if the shift operation is a right shift and narrowing operation and the input data value is an unsigned data value, the one bit shifter 51 left shifts the output of the thermometer value generation unit 50 by one bit position and the one bit appender 52 appends an unset bit (i.e. 0) at a least significant bit position to generate the mask data value.

Figure 4A:
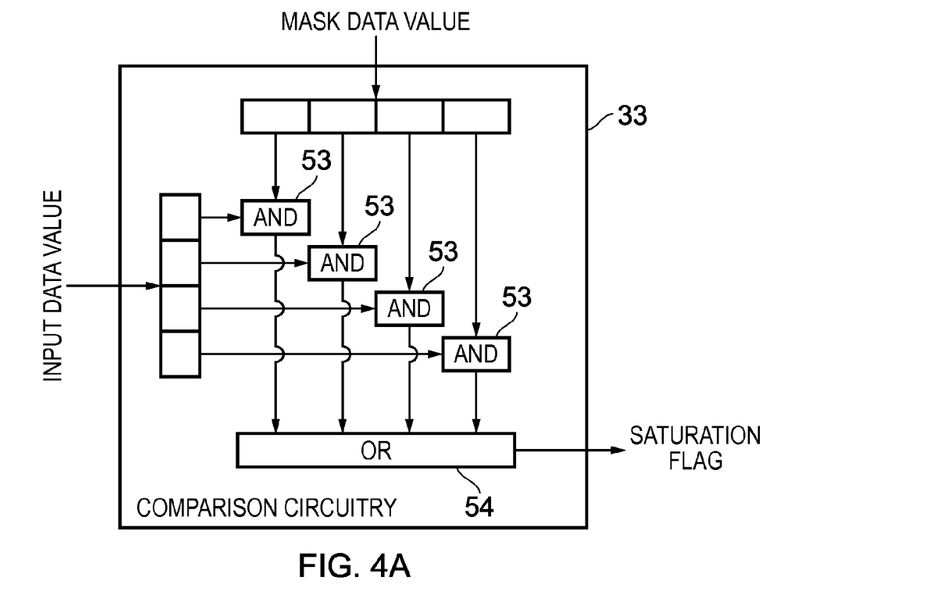
FIG. 4A schematically illustrates comparison circuitry in one embodiment.

FIG. 4A schematically illustrates comparison circuitry 33 which receives the input data value and a mask data value as its two inputs. Here, for simplicity and clarity of illustration, the comparison circuitry 33 is shown configured to receive 4-bit input data values, but it will be understood that the present techniques are not limited to 4-bit data values in any way. The comparison circuitry 33 comprises AND gates 53, the output of which provide the inputs to the 4-way OR gate 54. Accordingly, when a mask data value is received, if any bits are set at matching bit positions in the input data value and the mask data value the output of the comparison circuitry, i.e. the saturation flag, will be set.

Figure 4B:
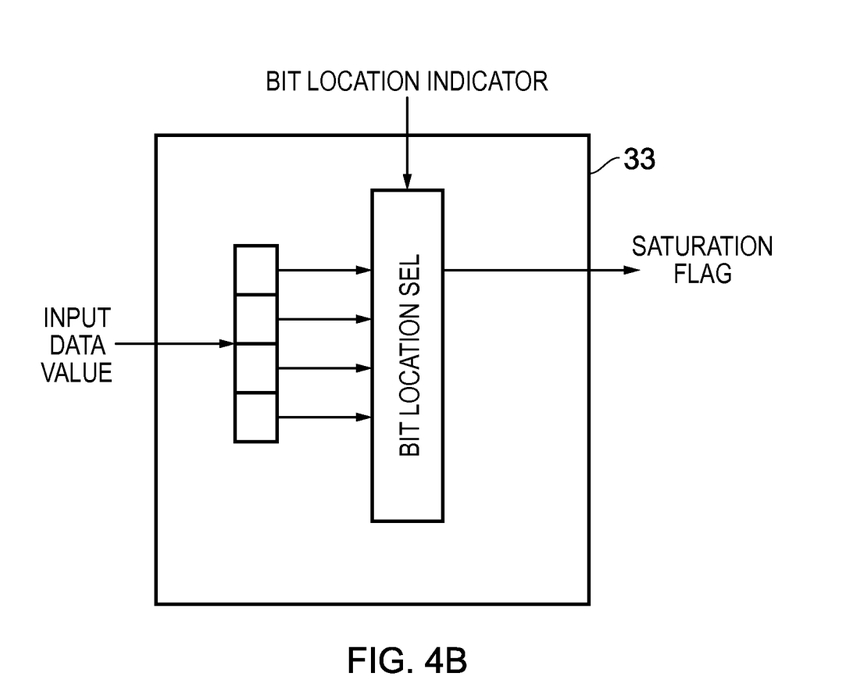
FIG. 4B schematically illustrates comparison circuitry in one embodiment.

FIG. 4B schematically illustrates an alternative configuration for the comparison circuitry 33, where a bit location indicator is received in a format where the value of the bit location indicator gives the bit location(s) in the input data value. A bit location selector is used to select the bit location(s) of the input data value identified by the value of the bit location indicator. In the example shown this is just one bit location (uppermost as illustrated). This then provides the saturation flag. Where more than one bit location of the input data value is identified by the value of the bit location indicator, the values of these identified bits may for example be combined by an OR operation to provide the saturation flag.

FIG. 5A shows example Verilog code representing the logic which is used in thermometer value generation unit 50 of the mask generation circuitry 49 (see FIG. 3). This generates a left-aligned string of 1s for left shifts, with the number of 1s given by the shift distance, and a right-aligned string of 0s for right shifts, with the number of 0s being given by $(w-r)+d-1$, where w is the input data width (in this case 16), r is the narrowed output data value width (in this case 8) and d is the shift distance. The thermometer values thus generated are shown in FIG. 5B.

FIGS. 6-9 show example input data values, shift distances, corresponding mask values and saturation condition determinations for the different possible combinations of left shift or right shift (and narrow), and unsigned or signed (positive or negative) input data values.

Figure 6:
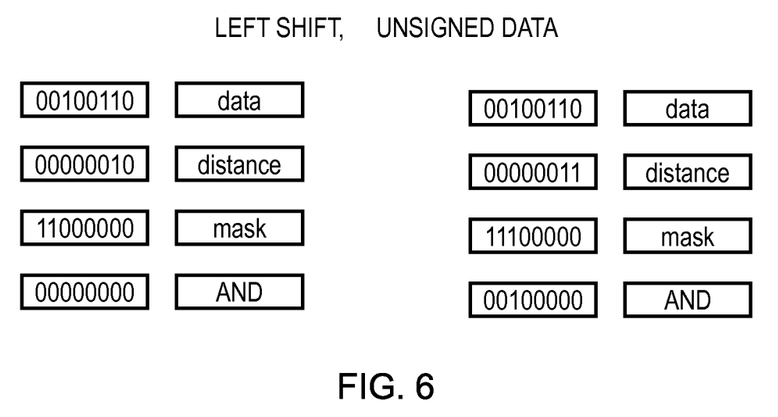
FIG. 6 shows examples of determining if a saturation condition exists for unsigned data subjected to a left shift operation in one embodiment.

FIG. 6 shows an example where a left shift operation is to be carried out on an unsigned data value. In the left hand example in FIG. 6 the shift distance d=2 and the w-bit mask (where w=8 in this example) is generated as a left-aligned string of d 1s concatenated with a string of w-d 0s, i.e. in this example two 1s followed by six 0s. Accordingly, when this mask is bit-wise ANDed with the input data value no 1s are set at the same bit locations and therefore it is determined that no saturation will occur. Viewed another way, this can be understood in terms of the fact that the input data value has two 0s at its most significant bit positions, which are the bit positions which will be shifted out of range by the shift of shift distance d=2. This is to be compared with the similar example shown on the right hand side of FIG. 6 where the same input data value is subjected to a left shift of distance d=3. This gives a mask value of three 1s followed by five 0s and accordingly the third most significant bit position has a 1 set in both the data and the mask, giving a one at this position in the ANDed output of the comparison, meaning that saturation will occur. This is because the bit set at the third most significant bit position of the input data value will be shifted out of range by this left shift of distance 3.

Figure 7:
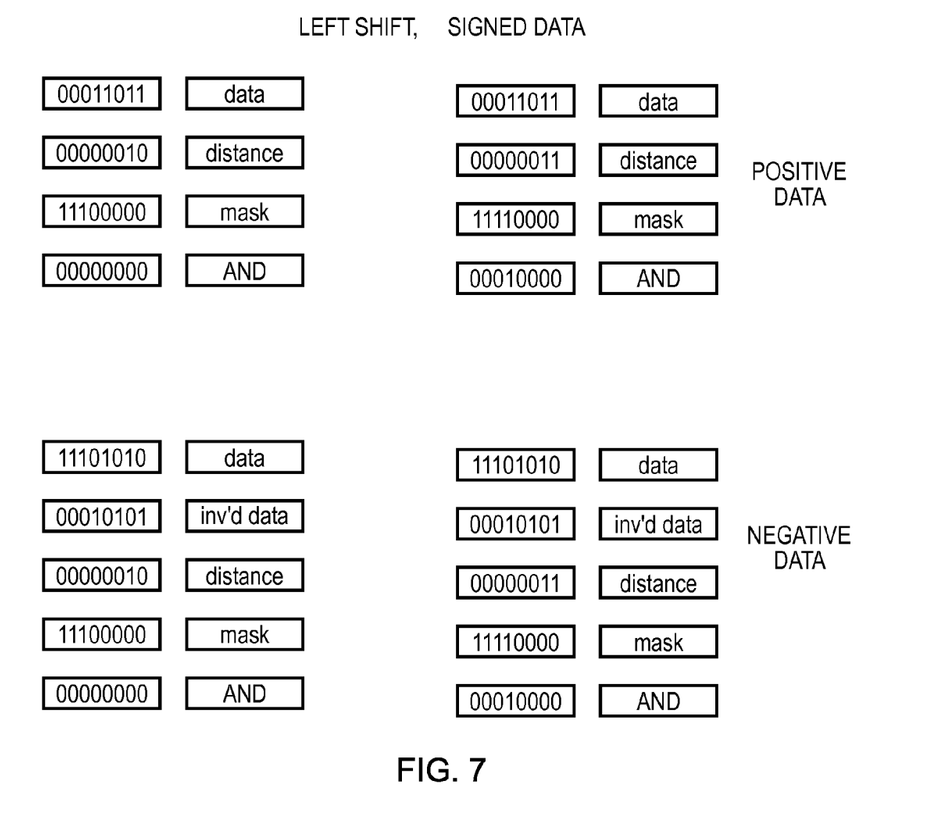
FIG. 7 shows examples of determining if a saturation condition exists for positive signed data and negative signed data subjected to a left shift operation in one embodiment.

FIG. 7 shows examples of left shift operations being carried out on signed data values. The upper two examples are for positive input data values whilst the lower two examples are for negative input data values. Here a critical factor is the use of the most significant bit position of the input data value to represent the sign of the input data value. Accordingly, in the two upper examples this most significant bit of the input data value is 0, whilst in the lower two examples this most significant bit value is 1. As in the example of FIG. 6 the left hand examples show a left shift of distance d=2, whilst the right hand examples show a left shift of distance d=3. For a left shift applied to signed data the mask data value is generated as a left aligned string of d+1 1s concatenated with a string of w−(d+1) 0s. Hence, in the left hand examples in FIG. 7 (where the shift distance is 2) the masked data values are three is followed by five 0s. Conversely, in the right hand examples in FIG. 7 (where the shift distance is 3) the mask data values comprise four 1s followed by four 0s. A further feature to note with respect to FIG. 7 when the input data value is negative (lower two examples in FIG. 7), i.e. where the input data value has a 1 in the most significant bit position, the input data value is first inverted before being compared with the mask. This simplifies the provision of the mask generation circuitry and the comparison circuitry. In the left hand examples (with a shift distance of two) in FIG. 7 no saturation will occur, whilst in the right hand examples in FIG. 7 (with a shift distance of three) saturation will occur.

Figure 8:
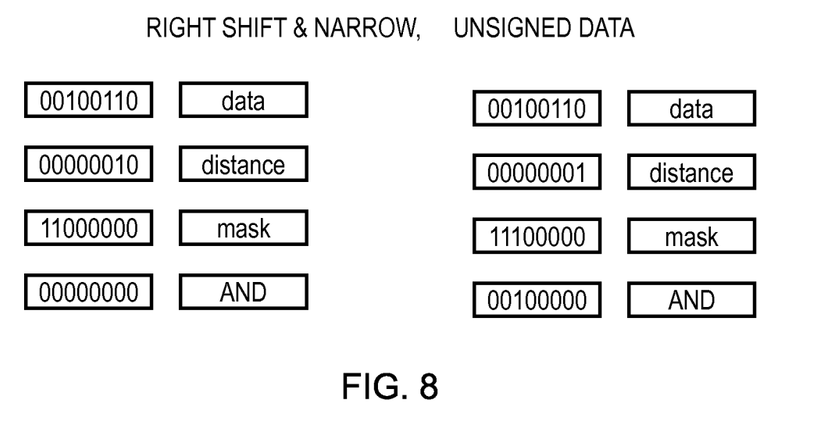
FIG. 8 shows examples of determining if a saturation condition exists for unsigned data subjected to a right shift and narrow operation in one embodiment.

FIG. 8 shows examples where a right shift and narrow operation is performed on unsigned input data values. In the examples shown in FIG. 8 an 8-bit unsigned input data value is narrowed to a 4-bit result, i.e. after the right shift operation on the 8-bit input data value the uppermost 4 bits of the result value are discarded. Hence, in these examples saturation will occur if bits of the input data value are shifted into bit positions above (i.e. at more significant bit positions than) the 4 bits of the output data result. Here (for a right shift and narrow operation on unsigned data) the mask value is generated as a left aligned string of (w−r)−d 1s concatenated with a string of r+d 0's, where w is the input data width, r is the result data width and d is the shift distance. It may commonly be the case that r=w/2 (such as in the illustrated examples in FIG. 8 where an 8-bit input data value is narrowed to a 4-bit output value) and in such cases a simplified description of the mask is that the w-bit mask comprises a left aligned string of w/2−d 1s concatenated with string of w/2+d 0s. Accordingly, in the examples illustrated in FIG. 8 on the left the mask comprises two 1s concatenated with six 0s, ensuring that no bits can be set in the input data value at bit positions which will be shifted into bit positions in the shifted data value which lie in the upper half of the 8-bit value, i.e. at more significant bit positions than can be represented by the output 4-bit data value. In the example on the right in FIG. 8 the shift distance is one and accordingly the mask value generated has three 1s concatenated with five 0s. Furthermore, as can be seen in the example on the right of FIG. 8, the input data value has a bit set (at bit position 6) which will remain in the upper half when right shifted by one bit and hence saturation will occur in this example.

Figure 9:
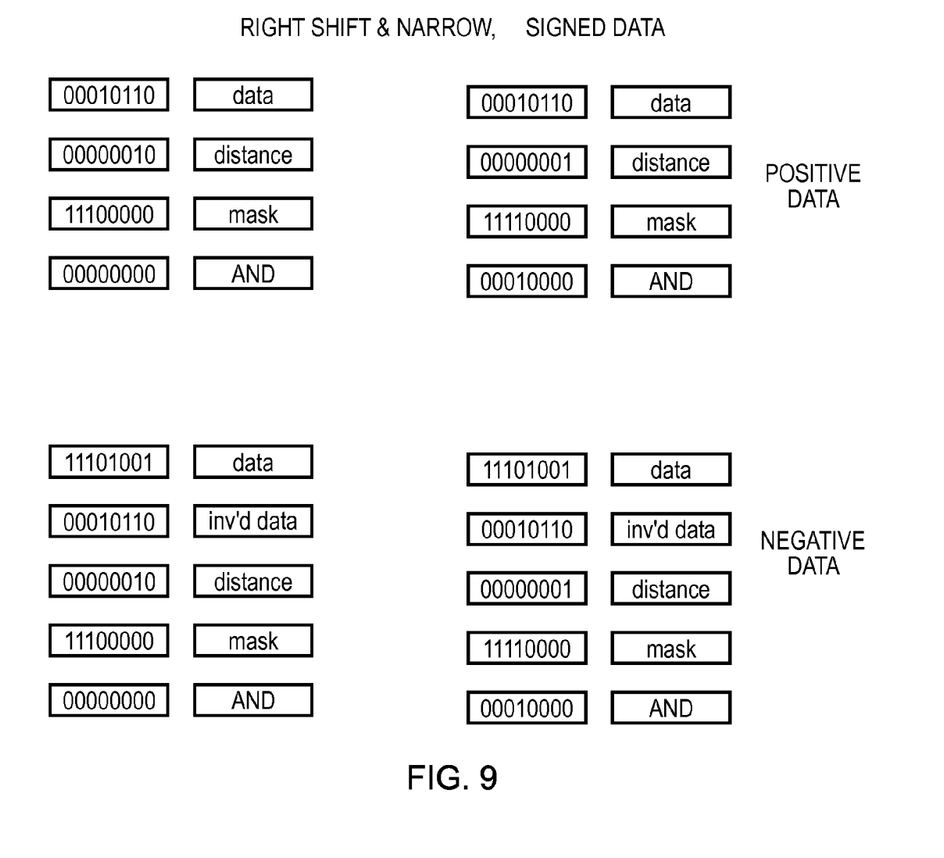
FIG. 9 shows examples of determining if a saturation condition exists for positive signed data and negative signed data subjected to a right shift and narrow operation in one embodiment.

FIG. 9 illustrates examples for a right shift and narrow operation on signed data. In this case, the mask is generated as a left-aligned string of (w−r)−d+1 1s concatenated with a string of (w−r)+d−1 0s, where w is the input data length, r is the narrowed output data length and d is the shift distance. If, as is the case here, the output data length (4-bit) is half the input data length (8-bit) the mask definition contracts to being a left aligned string of w/2−d+1 1s concatenated with a string of w/2+d−1 0s. The upper two examples in FIG. 9 are for positive signed input data values, whilst the lower two examples are for negative signed input data values. Here, as was the case in the examples given in FIG. 7, where the input data value is a negative signed data value it is first inverted before being compared to the generated mask. In the two examples on the left of FIG. 9 the shift distance d=2, whilst in the two examples on the right of FIG. 9 the shift distance d=1. Accordingly, in the two examples on the left of FIG. 9 the mask is a string of three 1s followed by five 0s, whilst in the two examples on the right the mask is a string of four 1s followed by four 0s. No saturation will occur in the examples on the left in FIG. 9 since there are no bits set at bit positions in the input data value which, once shifted by the shift operation, will be found at bit positions above those which are represented in the narrowed output data value. However by contrast, in the two examples on the right of FIG. 9 saturation will occur because the input data value in the positive data example and the inverted data value in the negative data example have a bit set in the fifth bit position (counting from the right) meaning that after the right shift of distance d=1 this set bit will be in the most significant bit position of the narrowed output data value. Since this most significant bit position of the output data value is reserved to indicate the sign of the data value, these output data values have saturated since this bit position has been overwritten.

Figure 10:
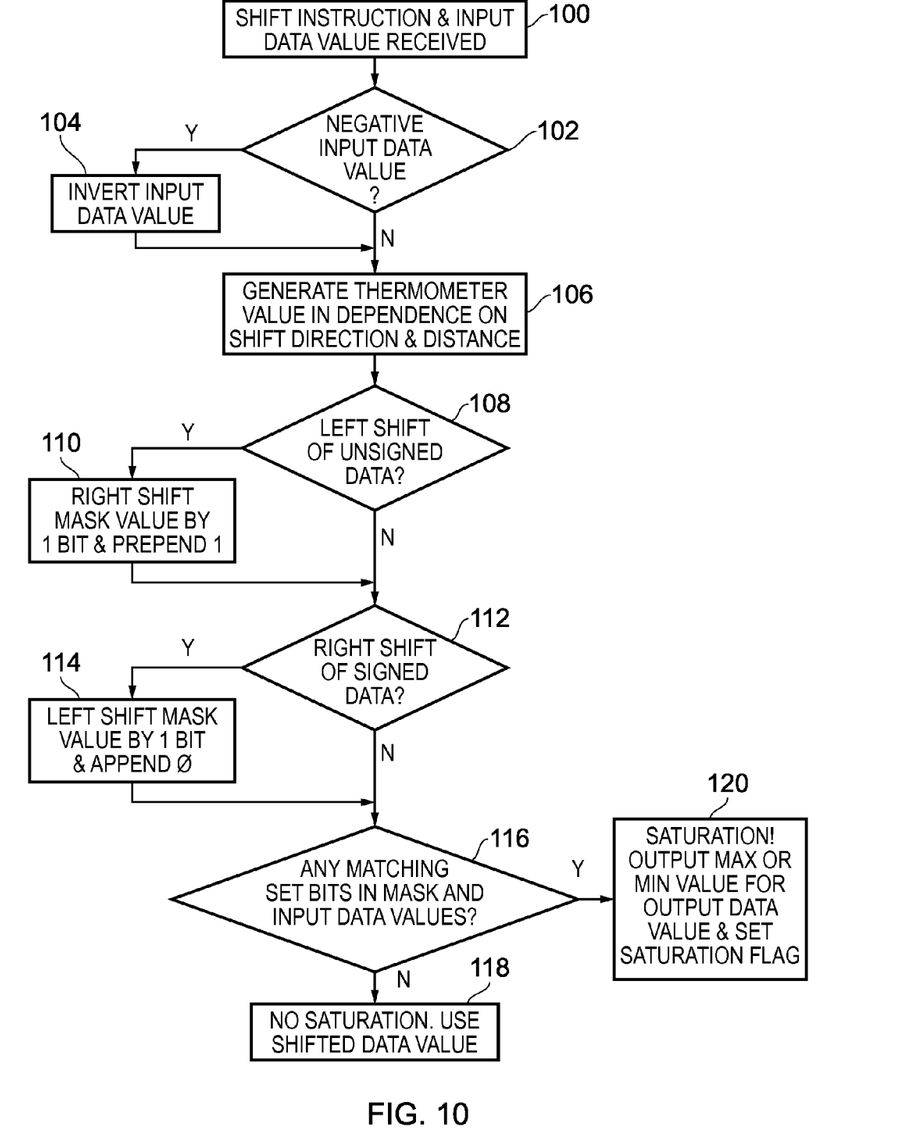
FIG. 10 schematically illustrates a sequence of steps which are taken in the method of one embodiment.

FIG. 10 illustrates a series of steps which are taken in the method of one embodiment. At step 100 a shift instruction and data value are received by the execution pipeline which comprises the shift circuitry, mask generation circuitry and comparison circuitry described above. It will be understood that what is actually received by the execution pipeline will typically be control signals derived from the particular form of the shift instruction. It is then determined, at step 102 if the input data value has a negative value. If it does then the flow proceeds to step 104 where the input data value is inverted. Otherwise the flow proceeds directly to step 106. Here a thermometer value is generated in dependence on the shift direction and distance to form the basis of the mask value. Then at step 108 it is determined if the shift instruction indicates that this is a left shift of unsigned data. If it is then the flow proceeds via step 110, where the mask value is right shifted by one bit and a 1 is prepended, i.e. appended as an additional most significant bit of the mask value. At step 112 it is determined if the shift instruction indicates that this is a right shift of signed data. If it is then the flow proceeds via step 114 where the mask value is left shifted by one bit and a 0 is appended as an additional least significant bit of the mask value. Then at step 116 the comparison circuitry determines if there are any matching set bits in the mask and input data values. If there are not then the flow proceeds to 118 where it is concluded that there will not be saturation and the shifted data value can be used. If however there are any matching set bits in the mask and input data values then the flow proceeds to step 120 where it is concluded that saturation will occur and a maximum or minimum value for the output data value is output in place of the shifted data value (a maximum value being output for an unsigned input data value or a positive signed input data value, and a minimum value being output for a negative signed input data value) and the saturation flag is set.

Although particular embodiments of the invention have been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. Apparatus for data processing, comprising:
   shift circuitry configured to perform a shift operation in response to a shift instruction, wherein the shift operation is performed on an input data value and comprises shifting bits of the input data value in a direction specified by the shift instruction to generate a shifted data value;
   bit location indicator generation circuitry configured to generate a bit location indicator, wherein the bit location indicator indicates at least one bit location in the input data value which must not have a bit set if the shifted data value is not to saturate; and
   comparison circuitry configured to compare the bit location indicator with the input data value and to indicate a saturation condition if any bits are indicated by the bit location indicator for bit locations which hold set bits in the input data value,
   wherein the bit location indicator generation circuitry and comparison circuitry are configured to operate in parallel with the shift circuitry;
   wherein the bit location indicator generation circuitry comprises mask generation circuitry configured to generate a mask data value as the bit location indicator, wherein the mask data value has bits set at bit locations corresponding to bit locations in the input data value which must not have bits set if the shifted data value is not to saturate;
   wherein the mask data value comprises a sequence of set bits concatenated with a sequence of unset bits, wherein the relative lengths of the sequence of set bits and the sequence of unset bits is determined in dependence on a shift distance specified by the shift instruction.

2. The apparatus as claimed in claim 1, further comprising inversion circuitry configured to invert the input data value to generate an inverted input data value when the input data value is a negative signed data value and the bit location indicator generation circuitry and the comparison circuitry are configured to substitute the inverted input data value for the input data value.

3. The apparatus as claimed in claim 1, wherein the shift operation is a left shift and the input data value is an unsigned data value, and the mask generation circuitry is configured to generate the mask data value comprising a left-aligned sequence of set bits of a length given by the shift distance followed by a sequence of unset bits which complete the mask data value.

4. The apparatus as claimed in claim 1, wherein the shift operation is a left shift and the input data value is a signed data value, and the mask generation circuitry is configured to generate the mask data value comprising a left-aligned sequence of set bits of a length given by the shift distance plus one, followed by a sequence of unset bits which complete the mask data value.

5. The apparatus as claimed in claim 1, wherein the shift operation is a right shift and narrowing operation to generate a narrowed shifted data value and the input data value is an unsigned data value, and
   the mask generation circuitry is configured to generate the mask data value comprising a left-aligned sequence of set bits of a length given by the data width of the input data value minus the data width of the narrowed shifted data value minus the shift distance followed by a sequence of unset bits which complete the mask data value.

6. The apparatus as claimed in claim 1, wherein the shift operation is a right shift and narrowing operation to generate a narrowed shifted data value and the input data value is a signed data value, and
   the mask generation circuitry is configured to generate the mask data value comprising a left-aligned sequence of set bits of a length given by one plus the data width of the input data value minus the data width of the narrowed shifted data value minus the shift distance followed by a sequence of unset bits which complete the mask data value.

7. The apparatus as claimed in claim 1, wherein the shift operation is a right shift and narrowing operation to generate a narrowed shifted data value, wherein the apparatus is configured to identify if the shift distance is greater than a value given by the data width of the input data value minus the data width of the narrowed shifted data value and to override the mask generation circuitry and comparison circuitry to indicate that the saturation condition is not met.

8. The apparatus as claimed in claim 1, wherein when the shift operation is a left shift and the mask generation circuitry is configured to generate the mask data value to comprise a left-aligned sequence of set bits of a length given by the shift distance followed by a sequence of unset bits which complete the mask data value, and
   the mask generation circuitry is configured to use the mask data value unamended if the input data value is an unsigned data value and to right shift the mask data value and append a set bit at a most significant bit position if the input data value is a signed data value.

9. The apparatus as claimed in claim 1, wherein when the shift operation is a right shift and narrowing operation and the mask generation circuitry is configured to generate the mask data value to comprise a right-aligned sequence of unset bits of a length given by the data width of the input data value minus the data width of the narrowed shifted data value plus the shift distance minus one preceded by a sequence of set bits which complete the mask data value, and the mask generation circuitry is configured to use the mask data value unamended if the input data value is a signed data value and to left shift the mask data value and append an unset bit at a least significant bit position if the input data value is an unsigned data value.

10. The apparatus as claimed in claim 1, wherein a bit set at a bit location has a value of 1 and an unset bit at the bit location has a value of 0.

11. The apparatus as claimed in claim 1, wherein a bit set at a bit location has a value of 0 and an unset bit at the bit location has a value of 1.

12. The apparatus as claimed in claim 1, further comprising negative shift distance identification circuitry configured to identify if the shift distance has a negative value and, if the shift distance does have a negative value, to cause the mask generation circuitry to interpret the shift distance as a positive value in association with a shift operation in an opposite direction to that specified by the shift instruction.

13. The apparatus as claimed in claim 1, wherein the shift circuitry is configured, in response to the saturation condition, to output the shifted data value having a maximum value for the data width of the shifted value when the input data value is an unsigned data value or a positive signed data value, and is configured to output the shifted data value having a minimum value for the data width of the shifted value when the input data value is a negative signed data value.

14. The apparatus as claimed in claim 1, wherein the bit location indicator generation circuitry is configured to generate the bit location indicator having a value indicative of the at least one bit location.

15. A method of data processing comprising the steps of:
performing a shift operation in response to a shift instruction, wherein the shift operation is performed on an input data value and comprises shifting bits of the input data value in a direction specified by the shift instruction to generate a shifted data value;
generating a bit location indicator, wherein the bit location indicator indicates at least one bit location in the input data value which must not have a bit set if the shifted data value is not to saturate;
comparing the bit location indicator with the input data value; and
indicating a saturation condition if any bits are indicated by the bit position indicator for bit locations which hold set bits in the input data value,
wherein the generating, comparing and indicating steps as a group are performed in parallel with the performing a shift operation step;
wherein a mask data value is generated as the bit location indicator, wherein the mask data value has bits set at bit locations corresponding to bit locations in the input data value which must not have bits set if the shifted data value is not to saturate;
wherein the mask data value comprises a sequence of set bits concatenated with a sequence of unset bits, wherein the relative lengths of the sequence of set bits and the sequence of unset bits is determined in dependence on a shift distance specified by the shift instruction.

16. Apparatus for data processing, comprising:
means for performing a shift operation in response to a shift instruction, wherein the shift operation is performed on an input data value and comprises shifting bits of the input data value in a direction specified by the shift instruction to generate a shifted data value;
means for generating a bit location indicator, wherein the bit location indicator indicates at least one bit location in the input data value which must not have a bit set if the shifted data value is not to saturate;
means for comparing the bit location indicator with the input data value; and
means for indicating a saturation condition if any bits are indicated by the bit location indicator for bit locations which hold set bits in the input data value,
wherein the means for generating, comparing and indicating as a group are configured to operate in parallel with the means for performing a shift operation;
wherein the means for generating a bit location indicator comprises means for generating a mask data value as the bit location indicator, wherein the mask data value has bits set at bit locations corresponding to bit locations in the input data value which must not have bits set if the shifted data value is not to saturate;
wherein the mask data value comprises a sequence of set bits concatenated with a sequence of unset bits, wherein the relative lengths of the sequence of set bits and the sequence of unset bits is determined in dependence on a shift distance specified by the shift instruction.

* * * * *